United States Patent [19]

Stacey

[11] Patent Number: 4,669,024
[45] Date of Patent: May 26, 1987

[54] MULTIPHASE FREQUENCY SELECTIVE PHASE LOCKED LOOP WITH MULTIPHASE SINUSOIDAL AND DIGITAL OUTPUTS

[75] Inventor: Eric J. Stacey, Penn Hills, Pa.

[73] Assignee: Westinghouse Electric Corp., Pittsburgh, Pa.

[21] Appl. No.: 790,680

[22] Filed: Oct. 23, 1985

[51] Int. Cl.$^4$ .............................................. G06F 15/31
[52] U.S. Cl. ...................................... 361/85; 324/86; 364/721
[58] Field of Search ............................ 361/76, 78, 85; 323/211; 324/83 D, 83 R, 86, 108; 307/80, 81, 511, 510; 364/721, 718

[56] References Cited

U.S. PATENT DOCUMENTS

4,159,527  6/1979  Yahata .................................. 364/721
4,327,420  4/1982  Golula .................................. 364/721

Primary Examiner—A. D. Pellinen
Assistant Examiner—H. L. Williams
Attorney, Agent, or Firm—M. J. Moran

[57] ABSTRACT

A circuit for providing a multiphase digitally synthesized sinusoidal output signal representative of a predetermined symmetrical component set of a multiphase source signal and having a predetermined relationship therewith is taught. The circuit comprises a phase comparator, a phase shifter and a synthesizer. The phase comparator produces an output representative of the phase error in the predetermined phase relationship between the source signal and the output signal. The phase shifter has a variable frequency output for shifting the phase of the synthesized output signal in response to the phase error output signal of the phase comparator. The synthesizer digitally synthesizes at a predetermined amplitude the multiphase sinusoidal output signal. The synthesizer is responsive to the phase shifting output of the phase shifter so as to decrease the phase error between the source signal and output signal. When the phase error has been reduced to substantially a zero value, the output of the synthesizer will lock into a predetermined phase relationship with the source signal. The synthesized output signal can be in phase or in quadrature with the source signal. Either the positive or negative sequence set of the multiphase source signal can be used. In an alternate embodiment, a second synthesizer is provided for producing a second multiphase synthesized output signal that is in quadrature with the first multiphase synthesized output signal that is in phase with the positive sequence set of the multiphase source signal.

31 Claims, 8 Drawing Figures

MULTIPHASE FREQUENCY SELECTIVE PHASE LOCKED LOOP WITH MULTIPHASE SINUSOIDAL AND DIGITAL OUTPUTS

CROSS-REFERENCE TO RELATED APPLICATIONS

The material presented herein is related to the material presented in the copending, commonly assigned application Ser. No. 790,681, filed Oct. 23, 1985 entitled "Line Fault Tolerant Synchronous Timing Reference for Static VAR Generators" Brennan and A. Abbondanti.

FIELD OF THE INVENTION

This invention relates to apparatus used in detecting and measuring symmetrical components in multiphase ac electrical systems and more particularly to phase locked loop circuits which generate a multiphase output signal having a predetermined phase relationship with a multiphase source signal.

BACKGROUND OF THE INVENTION

Sinusoidal currents and voltages of a multiphase ac electrical system are commonly represented as a set of rotating vectors. These vectors which may be unsymmetrical or unbalanced can be resolved into three symmetrical systems of three equal vectors each which are known as positive, negative and zero sequence components. The detection of these components is useful in determining the degree of unbalance in the phases of the electrical system and can be used to indicate the occurrence of a fault in the system. With a balanced system, normally only positive sequence components are present. Negative sequence components occur if there is a phase unbalance while zero sequence components only flow if there is a four wire connection such as a grounded wye. In general, the positive sequence components are used in many control and metering applications because these components represent the real portion of the total applied voltage, current, or power. For example, in a motor, forward torque is a function of the positive sequence voltage and the positive sequence current. In power regulators, the positive sequence components are measured to determine the real power applied. One means currently in use for measuring and detecting positive sequence components is the use of a positive sequence bandpass filter. Such a filter is described in U.S. Pat. No. 4,479,160 issued Oct. 23, 1984 and entitled "Bandpass Sequence Filters for Symmetrical Components of Multiphase AC Power Systems" and assigned to the assignee of the present invention. One problem in using the output of such a filter for measuring and metering applications is that the amplitude and phase of the outputs of the filter are sensitive to unbalance in the inputs. This means that any phase or amplitude unbalance in the input is partially carried through to the filter.

A stable timing waveform which would remain precisely phase locked to the symmetrical positive phase sequence components of a source signal, even if the presence of severe distortion and disturbances, would be useful. Further, a circuit in which the positive sequence component output will remain phase locked even though all but one of the phases of the source signal are lost would also be useful. It is the object of the invention to produce a stable phase locked set of symmetrical positive or negative sequence outputs even during the presence of severe unbalance or loss of all the source phases but one. It is a further object of the invention to provide a circuit in which the symmetrical component output may be phase locked to any set of the symmetrical components occurring in the source signal.

SUMMARY OF THE INVENTION

A circuit for providing a multiphase digitally synthesized sinusoidal output signal representative of a predetermined symmetrical component set of a multiphase source signal and having a predetermined phase relationship therewith is taught. The circuit comprises a phase comparator, a phase shifter and a synthesizer. The phase comparator produces an output representative of the phase error in the predetermined phase relationship between the source signal and the output signal. The phase shifter has a variable frequency output for shifting the phase of the synthesized output signal in response to the phase error output signal of the phase comparator. The synthesizer digitally synthesizes at a predetermined amplitude the multiphase sinusoidal output signal. The synthesizer is responsive to the phase shifting output of the phase shifter so as to decrease the phase error between the source signal and output signal. When the phase error has been reduced to substantially a zero value, the output of the synthesizer will lock into a predetermined phase relationship with the source signal. The synthesized output signal can be in phase or in quadrature with the source signal. In fact the multiphase synthesized output produced can have any desired phase relationship to the source signal. Either the positive or negative sequence set of the multiphase source signal can be used. In an alternate embodiment, a second synthesizer is provided for producing a second multiphase synthesized output signal that is in quadrature with the first multiphase synthesized output signal that is in phase with the positive sequence set of the multiphase source signal. The in phase and quadrature component sequence sets can be applied to an arbitrary set of multiphase signals to resolve these arbitrary signals into their real and reactive components.

BRIEF DESCRIPTION OF THE DRAWINGS

For a better understanding of the invention, reference may be made to the embodiments exemplary of the invention shown in the accompanying drawings wherein.

DETAILED DESCRIPTION

Figure 1:
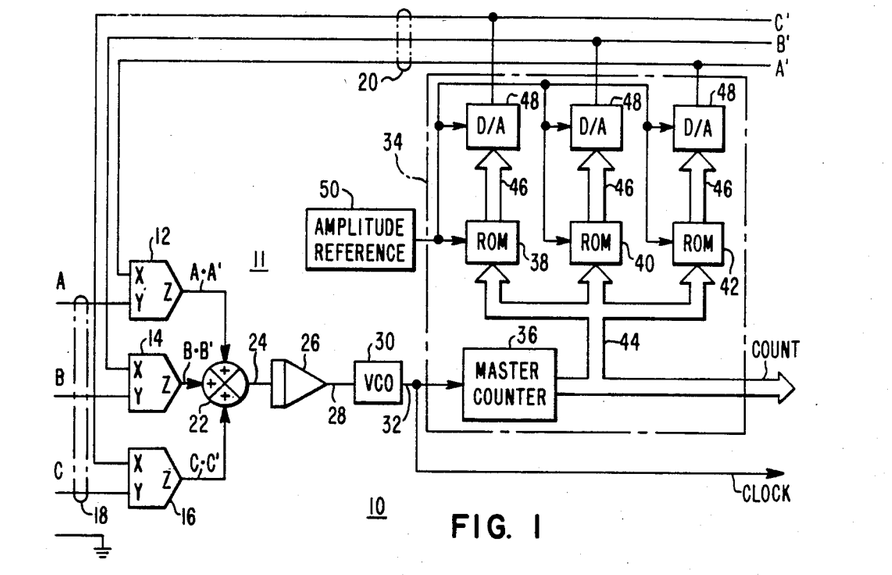
FIG. 1 is a three-phase embodiment of the invention producing cosine outputs of the fundamental frequency which lead the source signal by 90 degrees.
Figure 2A:
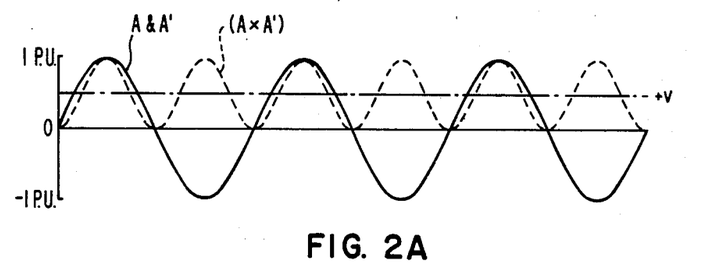
FIGS. 2A, 2B and 2C illustrate the point-by-point multiplication of one phase of the source signal and one phase of the output signal for in phase, out of phase and 90 degree phase shift conditions, respectively.
Figure 2B:
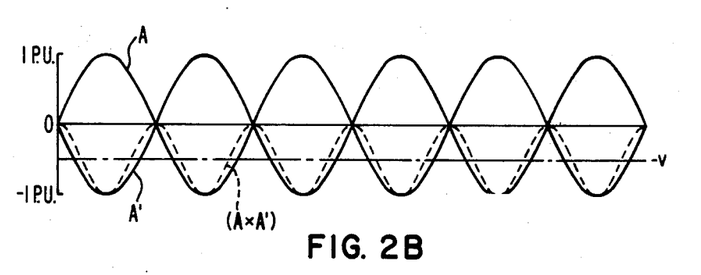
Figure 2C:
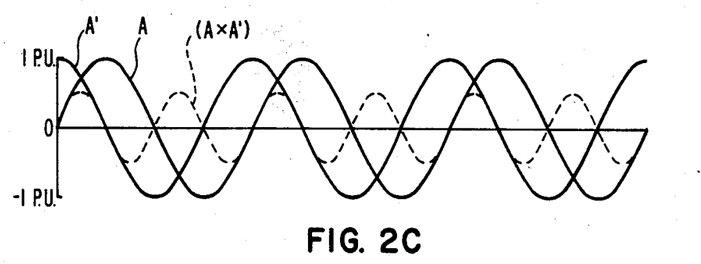

Referring to FIG. 1, a circuit for producing phase locked positive sequence cosine outputs is illustrated. The circuit 10 comprises a phase comparator 11 having analog multipliers 12, 14 and 16, each having inputs X and Y and an output Z that is the product of X and Y. The three phases A, B and C of the source signal 18 are connected to the Y inputs of the multipliers 12, 14 and 16, respectively. Connected to the X inputs of these multipliers is a synthesized component sequence set 20 having the phases A', B', C', which is also the output of the circuit 10. Each multiplier is in fact a phase comparator for the input and output signals of an individual phase. The mean value of the Z output of each multiplier is dependent only on the fundamental frequency of the synthesized output signal A', B' or C', and is characterized as a dc signal having a large double frequency ripple component. This is illustrarted in FIGS. 2A and 2B where the phases A and A' are point-by-point multiplied together. For illustrative purposes, the two phases are assumed to have 1 per unit (p.u.) amplitude. In FIG. 2A the phases A and A' are in phase and thus their waveforms are shown superimposed with the product of A and A' (A×A') being a signal having twice the fundamental frequency and a mean output shown by the line +v. In FIG. 2B the phases A and A' are out of phase (i.e. 180 degrees displaced in phase) with the product of A and A' (A×A') being a signal having twice the fundamental frequency and a mean output shown by the line −v. Where the phases are displaced by 90 degrees as shown in FIG. 2C, the resultant mean output is 0. This is the condition for zero phase error. In this application, the phase relationship between the two inputs of each multiplier will be held close to 90 degrees and the mean value of its output will be held close to zero. In addition to the double frequency or second harmonic ripple component present in the multiplier output, some other ripple frequency components may be present due to harmonics which can be present on the three phase inputs. However, it does not affect the mean value of the phase error signal which is therefore insensitive to harmonics. The Z outputs of the multipliers 12, 14 and 16 have means values which represent the respective phase errors between the respective phases A, B and C of the the source signal 18 and the respective phases A', B' and C' of the synthesized output signal 20. The Z outputs of all the multipliers are summed at the summing point 22 which produces as an output a phase error signal 24 that is representative of the phase error of the selected sequence set of symmetrical components. For balanced conditions where only symmetrical components of the selected sequence exist, the second harmonic ripple present at each of the individual multiplier outputs cancels in the summation to form a phase error signal that is substantially free of ripple.

The phase error signal 24 is integrated at the non-inverting integrator 26 to obtain as an output an integrated phase error signal 28. This integrated phase error signal 28 is used as an input to a voltage controlled oscillator 30. Where the source signal 18 is substantially balanced, summing of the phase error signals, i.e. the outputs of the multipliers 12, 14 and 16, results in cancellation of the major second harmonic ac components, enabling the use of a faster slewing integrator. The output of the voltage controlled oscillator 30 is a clocking signal 32 that can be used externally as a clocking signal and also is provided to a synthesizer 34. The integrator 26 and the voltage controlled oscillator 30 are used as a phase shifting means. The synthesizer 34 is comprised of a digital counter 36 and a plurality of non-volatile memory devices such as ROMs and digital-to-analog converters. For the three phase system, three ROM devices 38, 40 and 42 are provided for phases A', B' and C', respectively. The counter 36 is triggered by the clocking signal 32 and provides a digital address count output that is variable from a starting address count value s to a final address count value f. An address bus 44 interconnects the output of the counter 36 with the input address busses of each of the ROM devices 38, 40 and 42. The address count output serves as the input address for the ROM device that is provided for each of the phases. The quantity ((f−s)+1) represents the desired number of steps into which the period of the synthesized output signal is divided. The address count corresponds on a one-to-one basis to the number of the step within the period of the synthesized output signal. Preferably, to ensure identical and symmetrical synthesized waveforms for all phases, the total number of address counts is a multiple of twice the number of phases. For a three phase input, an address count from 0 to 359 or from 1 to 360 will yield a balanced high quality output having 1 degree increments. Used in conjunction with ROM devices having 8-bit outputs programmed to output the three-phase synthesized outputs in binary form, phase lock accuracy of 0.2 degrees is possible. With this arrangement, the digital address count value can also be provided as an output from the circuit.

The frequency of the clocking signal 32 of the voltage controlled oscillator 30 is related to the magnitude of the integrated phase error signal 28. Typically, as the phase error increases, the frequency of the clocking signal 32 changes. The direction of the phase error determines whether the clocking signal frequency increases or decreases. This change in frequency increases or decreases the count rate of the digital counter 36 that in turn advances or retards the phase of the synthesized output with respect to the source signal, tending to reduce the phase error. As the phase error between the synthesized output signal 20 and the source signal 18 decreases towards zero, the output of the integrator 26 stabilizes, thus fixing the frequency of the clocking signal 32 of the voltage controlled oscillator 30 and maintaining the synthesized output in the desired predetermined phase relationship with the source signal. A normal three phase input will contain a relatively small amplitude set of negative sequence components, related to imbalance in the three phase voltages. These negative sequence components will result in some residual second harmonic ripple in the summed output of the three phase comparators, it will not, however, effect the mean output. The phase error integrator will tend to reduce this ripple so that it does not significantly modulate the frequency of the voltage controlled oscillator, and the synthesized output will be phase locked to the positive sequence set of symmetrical components. It is important to realize that by defining the phase relationship with the source signal, the frequency of the synthesized output signal is, by definition, the same as that of the source signal. However, the fact that the output signal and source signal are at the same frequency does not define their phase relationship.

Preprogrammed in each ROM is a look-up table having a plurality of individually accessible addresses corresponding to the address count output value of the counter. For each phase, stored at each address is a digital value representative of the output amplitude for that phase at that particular step within the period of the synthesized output signal corresponding to that address count output value. When a particular address count value is received on the input busses of the ROMs from the counter, the digital value for the amplitude corresponding to the address count value is placed on the output bus 46 of each ROM. For the circuit of FIG. 1, the three ROM devices 38, 40 and 42 are programmed to produce the phase sequence of A', B' and C', respectively. In the circuit of FIG. 1, the look-up table information of the memory devices is programmed to produce a synthesized symmetrical positive sequence set of output signals. When incorporated in the circuit depicted in FIG. 1, these outputs will be locked in quadrature leading the inputs by 90 degrees. As a result the synthesizer 34 is also known as a cosine synthesizer. Although a ROM device is shown for each phase, a single ROM device having a number of outputs sufficient to provide the digital information required for synthesizing the required number of sinusoidal output waveforms can be substituted for the three ROM devices. For example where an eight line output data bus is used for each phase, a single ROM device having a 24 line output data bus can be substituted.

Connected to each output data bus 46 of each ROM device for each phase is a digital-to-analog converter 48. The digital-to-analog converter 48 converts the digital values representative of the output amplitude for each phase at that particular step in the period of the synthesized output waveform into a substantially continuous sinusoidal waveform for each phases. By presenting the address information in an essentially simultaneous manner to the ROM devices, the synthesized waveforms for the phases A', B', and C' are synchronized with respect to one another at a predetermined phase relationship with one another, here 120 degrees and with respect the phases of the source signal 18. Thus as the address count value varies from the starting count value s to the final count value f, the digital-to-analog converters 48 produce the synthesized output signal 20 having the phase sequence A', B', and C'. When the address count value has reached the final address count value f, the counter is reset to the start address count value s allowing the cycle to be repeated. The digital synthesis of the output signal 18 allows the phase relationships between the synthesized phases to be accurately determined.

Preferably, an amplitude reference circuit 50 is connected to each of the digital-to-analog converters 42 for establishing the amplitude of each of the phases of the synthesized output signal 20. The amplitude of the synthesized phases is set to the maximum value acceptable at the multipliers. This is done to increase the signal-to-noise ratio. Further, for the purpose of obtaining a precise phase lock, the amplitude reference need not be a precise signal because the polarity of the phase error signal is integrated to obtain the required phase correction and the phase error signal is zero at phase lock.

Figure 3:
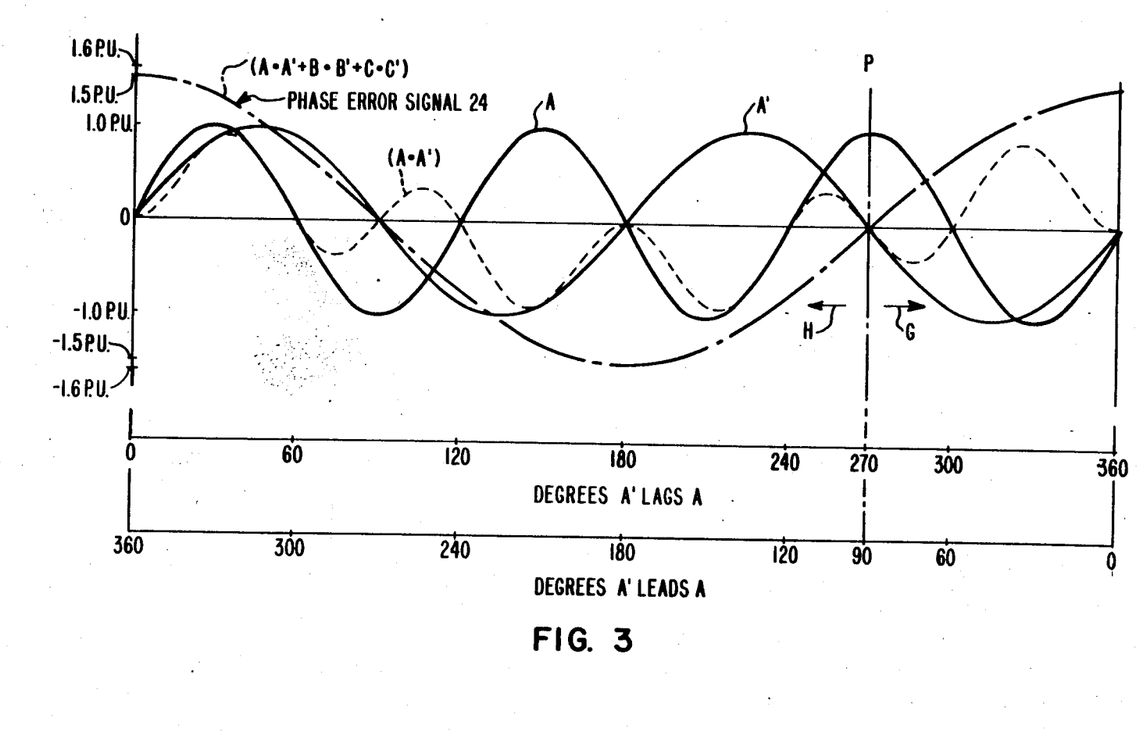
FIG. 3 illustrates the operation of a three-phase phase comparator over its complete operating range.

FIG. 3 illustrates the operation of the three-phase phase comparator over a range of phase difference where the synthesized outputs A', B', C' lag the inputs A, B, C from 0 to 360 degrees. Two scales are shown along the x-axis. These are (from left to right) 0 to 360 degrees for the outputs lagging the inputs and 360 to 0 degrees for outputs leading the inputs. The Y-axis scale is a per unit scale variable from −1.6 p.u. to +1.6 p.u. For clarity not all waveforms are shown, only the inputs A and A' and their product A×A', as obtained from the multiplier 12, of FIG. 1 are shown, together with the summed output, the phase error signal 24, for all phases as obtained from summing point 22. The circuit of FIG. 1 produces synthesized outputs which lead their respective inputs by 90 degrees, which is the same as lagging by 270 degrees. This is shown at point P of FIG. 3. It can be seen that the phase error signal 24 about this point becomes positive as lead (lag) in the output decreases (increases). This is indicated by the arrow G. This decrease will result in the integrator output 28 becoming more positive, causing the frequency of the voltage controlled oscillator 30 to temporarily increase and the phase position of the output to be restored to 90 degrees leading (270 degrees lagging). Similarly, it can be seen that the phase error signal about point P becomes negative as lead (lag) of the output increases (decreases). This is indicated by arrow H. This increase will result in the integrator output 28 becoming more negative, causing the frequency of the voltage controlled oscillator to temporarily decrease and the phase position of the output to be restored to 90 degrees leading (270 degrees lagging). The outputs are therefore maintained precisely phase locked to the source. Thus, the multipliers 12, 14 and 16 and summing point 22 comprise a phase comparator which is sensitive only to the selected symmetrical component set of fundamental frequency of the source signal that has three times the sensitivity of the individual phase comparators and which for balanced conditions is substantially free of ripple.

Other phase sequences as well as other phase relationships can also be achieved with this circuit. For example, the circuit produces the phase sequence A', B', C' which would be the positive sequence component of the source signal. This would be the preferred sequence in that the positive sequence components represent the real portion of the applied voltage, current or power. By switching the amplitude information contained in the memory devices 40 and 42, the phase sequence at outputs A', B' and C' is reversed and becomes negative. Having reversed the phase sequence it is possible to phase-lock to a set of negative sequence components present in a composite synthesized output. In practice if this is done, the output of the error integrator can be clamped to restrict its dynamic range and its slewing rate deliberately reduced to obtain improved reduction of the second harmonic ripple due to the (normally larger) positive sequence components.

The advantage in using digitally synthesized outputs lies in the fact that the outputs can be produced even though all but one of the phases of the source signal are lost. In fact where all of the phases of the source are lost the circuit can be modified so that the synthesized outputs remain in their latest phase relationship. This is termed "freewheeling". With a three phase system, the output of the synthesizer would normally be three 120 degree displaced waveforms representative of the positive sequence component of the source signal. However, displacements other than 120 can be achieved by changing the contents of the ROM devices.

Figure 4:
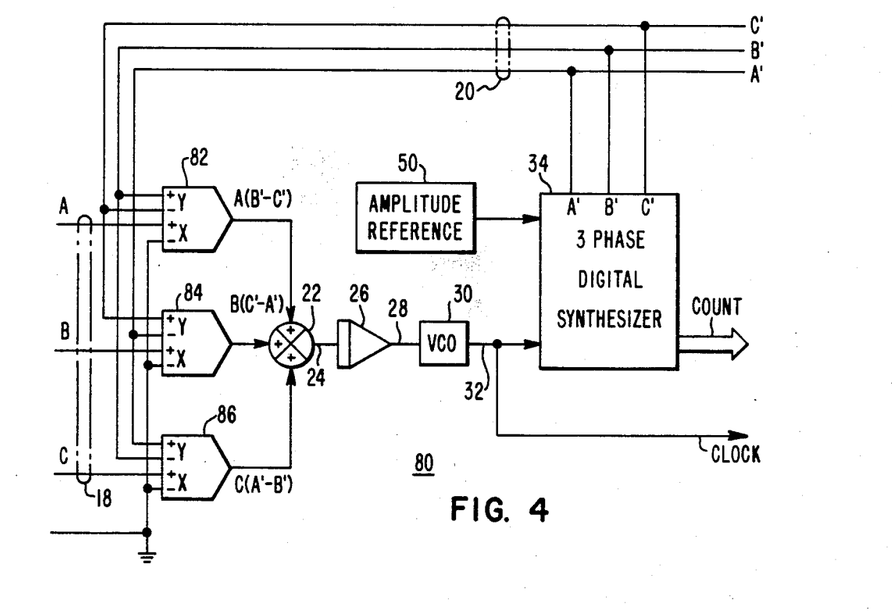
FIG. 4 is a three-phase system that produces sine outputs in phase with the source signal.
Figure 5:
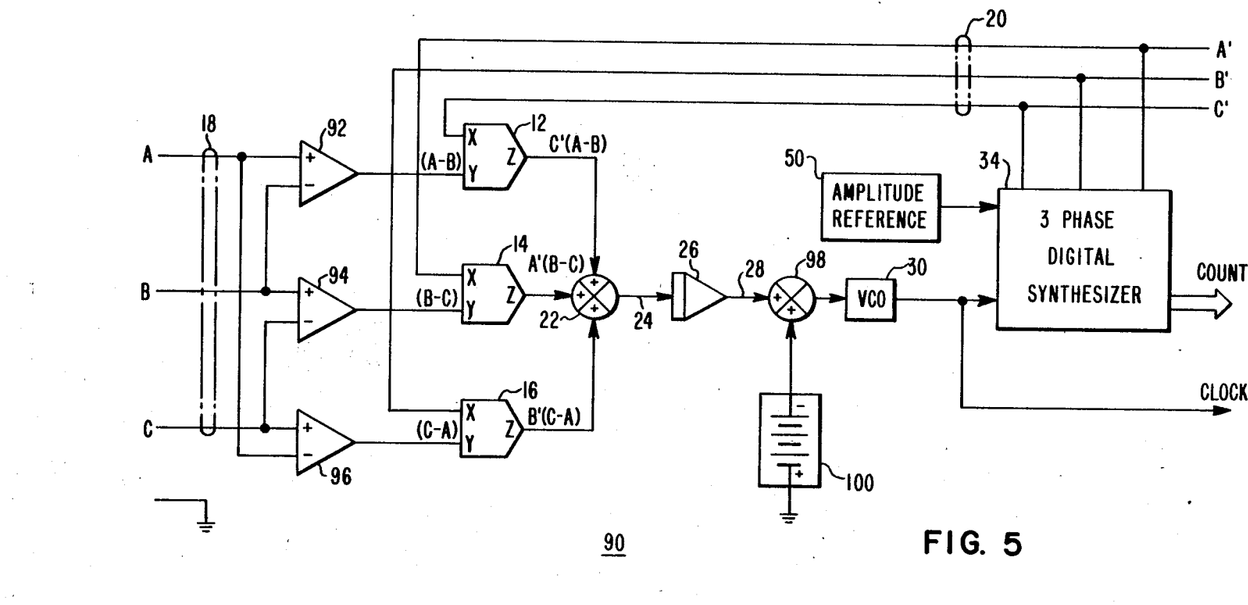
FIG. 5 is an alternate embodiment for producing sine outputs in phase with the source signal.

In FIGS. 4 and 5 are circuits substantially the same as that set forth in FIG. 1. Accordingly, in FIGS. 4 and 5 similar or unchanged components will be identified by the same reference numerals. In FIG. 4 a circuit 80 is shown that utilizes multipliers having differential inputs used to multiply the line-to-line synthesized outputs by the line-to-neutral source inputs, so that outputs are actually locked in phase with the source signals. In the circuit 80, differential analog multipliers 82, 84 and 86 have been substituted for the analog multipliers 12, 14 and 16 of FIG. 1. Each of the differential multipliers has differential inputs X and Y that are indicated by the plus and minus signs. Thus the differential inputs are +Y, −Y, +X and −X for each differential multiplier. The −X input of each of the multipliers is connected to the system ground. This represents a zero value input at this point. The three phases A, B and C of the source signal 18 are connected to the +X inputs of the multipliers 82, 84 and 86, respectively. Connected to the +Y inputs of the multipliers 82, 84 and 86 are the positive sequence outputs B', C' and A', respectively, of the synthesized output signal 20. Connected to the −Y inputs of these differential multipliers 82, 84 and 86 are the positive sequence outputs C', A' and B', respectively. The output of differential multiplier 82 is A(B'−C'), the output of differential multiplier 84 is B(C'−A') and the output of differential multiplier 86 is C(A'−B'). Vectorial analysis of the quantities within the parentheses will show that the quantity (B'−C') lags input A of the source signal by 90 degrees. Similarly, the quantities (C'−A') and (A'−B') lag by 90 degrees inputs B and C, respectively, of the source signal. A non-inverting intergrator 26 is used here to maintain phase lock so that A' is in phase with A, B' is in phase with B and C' is in phase with C. The remainder of the circuit is substantially identical to that previously described.

In FIG. 5, an alternate embodiment of achieving in-phase positive sequence components is illustrated. The circuit 90 uses the analog multipliers 12, 14 and 16 as shown in FIG. 1. However, here the phases A, B and C of the souce signal 18 are provided as inputs to the differential amplifiers 92, 94 and 96. Phase A of the source signal 18 is connected to the non-inverting input of differential amplifier 92 and also to the inverting input of differential amplifier 96. Phase B of the source signal 18 is connected to the non-inverting input of the differential amplifier 94 and is also connected to the inverting input of differential amplifier 92. Phase C of the source signal is connected to the non-inverting input of differential amplifier 96 and to the inverting input of differential amplifier 94. The output signals of the differential amplifiers 92, 94 and 96 are the quantities (A−B), (B−C) and (C−A), respectively. These signals in turn are connected to the Y inputs of the analog multipliers 12, 14 and 16, respectively. Connected to the X inputs of the three analog multipliers are the positive sequence outputs C', A' and B', respectively. Here the output values of the analog multipliers 12, 14 and 16 are the values C'(A−B), A'(B−C) and B'(C−A), respectively. Again, these values represent the phase error between the phases of the synthesized output signal and the source signal. The outputs of the analog multipliers are summed together at the summing point 22 to produced the mean phase error signal 24 that is inverted and integrated in the integrator 26. The output 28 of the integrator 26 is connected as an input to a second summing point 98. Also connected as an input is a center frequency reference 100. The output 102 of the summing point is connected as the input to the voltage controlled oscillator 30. With this arrangement the frequency reference 100 normally supplies the voltage controlled oscillator 30 with the nominal voltage required to obtain synchronous operation. The integrator output 28 is then only required to make up the small difference due to error of the reference or phase error between the three phase input and the three phase synthesized output.

Figure 6:
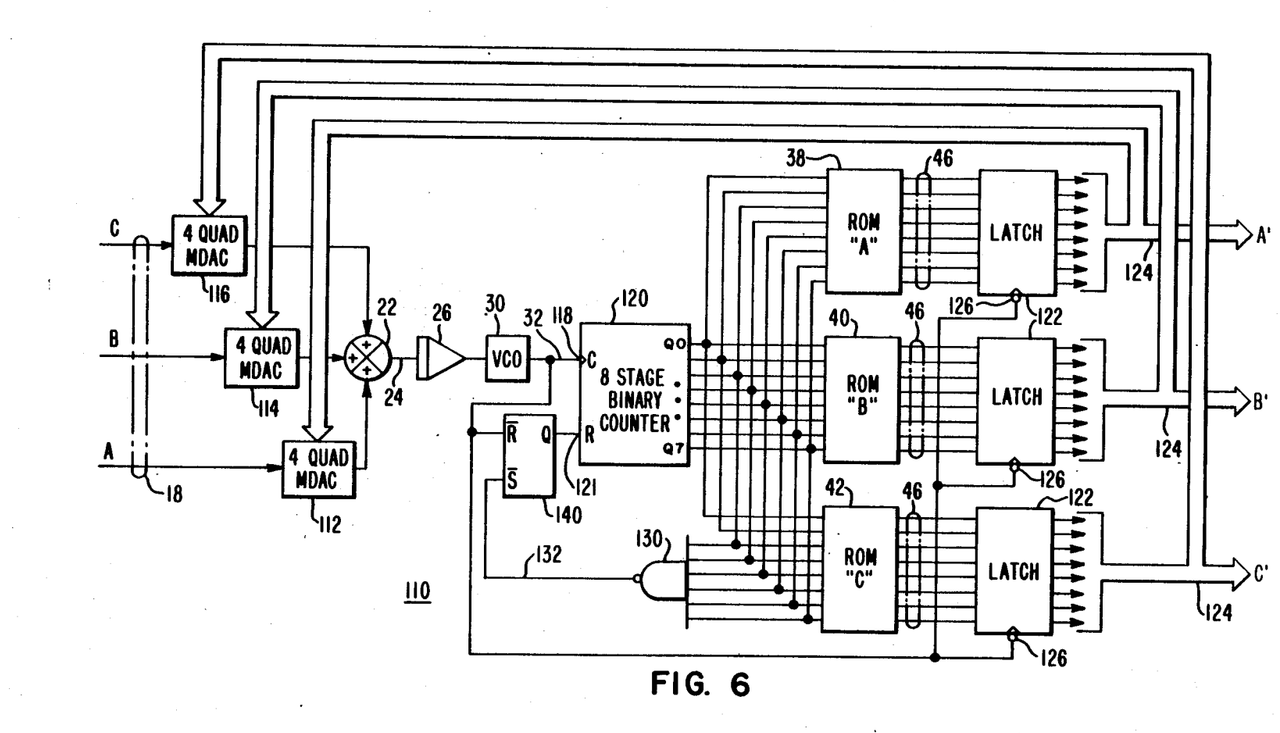
FIG. 6 is an embodiment of the invention producing digital positive sequence outputs.

For a more precise synthesized ouput and for a wider range of frequency, a digital synthesizer and multiplying digital-to-analog phase comparator is preferable. This is illustrated in FIG. 6. By using digital signal processing common errors produced by analog elements such as drift and offset can be eliminated. Also the accuracy is higher in that the accuracy is proportional to the number of bits used. In this arrangement, the digital outputs from the ROM devices are used with the digital multipliers in place of the synthesized sinusoidal output signals. The digital multipliers will produce an analog output that is the product of the analog and digital input signals. In the circuit 110, the multipliers 112, 114 and 116 are each provided with a digital input and an analog input. The phases A, B and C of the source signal 18 are connected to the analog inputs of the multipliers 112, 114 and 116. Connected to the digital inputs of the multipliers 112, 114 and 116 are the digital outputs of the ROM devices 38, 40 and 42, respectively, that produce the sequence component for the A', B' and C' phases, respectively. Preferably, the digital inputs of the multipliers can accept 8 bits, although higher numbers of bits can be used with resulting increase in accuracy. With 8 bits, however, the circuit will phase lock within 0.2 degrees without the use of precision components. Again, the outputs of the digital multipliers are summed to produce the mean phase error signal 24 at the summing point 22. This summed value is then integrated at the integrator 26 to provide the dc control signal for the voltage controlled oscillator 30. The output 32 of the voltage controlled oscillator 30 acts as the clock input 118 to an 8 stage binary counter 120 also having a reset input 121. The counter 120 is clocked on the positive edge of the output signal of the voltage controlled oscillator 30. This is indicated by the symbol  shown at the clock input 118. The address count value at the 8 stage output Q0 through Q7 of the counter 120 serves as the address for the ROM device for each phase. The output busses 46 of each ROM are each connected as inputs to a latching circuit 122. The output busses 124 of the latches 122 are then provided to the digital inputs of their corresponding multipliers. The latch outputs also can be used to provide the three phase binary coded output for use elsewhere. These outputs may be used directly in binary form or converted to analog outputs. The output 32 of the voltage controlled oscillator 30 is connected to the clock inputs 126 of the latches 122 which are negative edge triggered devices. A negative edge triggered device is indicated by the following symbol  appearing at the clock input 126 for the latch circuits 122. This insures that the outputs of the ROM devices have settled prior to the updating of the information contained in the latches 122.

For precise symmetry the counter 120 can be reset at an exact multiple of twice the number of phases. For 1 degree resolution a 360 step counter is needed, this would require 9 bits. It may be more convenient however, to employ standard binary counters having, 8, 12 or 16 bits operating at the highest count having the required multiple. For a three phase system as shown, an 8 bit counter would be reset after 252 counts, a 12 bit counter after 4092 counts and a 16 bit counter after 65,532 counts. The corresponding angular resolution would then be 1.429, 0.088 and 0.005 degrees for 8, 12 and 16 bits, respectively. The circuit shown in FIG. 6 utilizes a counter which is reset after 252 counts. It can be seen that the outputs Q2 through Q7 are connected to the inputs of the NAND gate 130. The output 132 of the NAND gate 130 is connected to the S̄ input of a RS flip-flop 140. The R̄ input of the flip-flop 140 is connected to the output 32 of the voltage controlled oscillator 30. The Q output of the flip-flop 140 is connected to the reset input 121 of the counter 120. When the count of 252 is reached, the output 132 of the NAND gate 130 becomes an active low thus causing the flip-flop 140 output Q to become active and reset the binary counter 120. Connection of the R̄ input to the output 32 of the voltage controlled oscillator 30 ensures that the counter 120 will not be reset until the desired count is achieved.

The circuits shown will produce synthesized waveforms that are representative of the positive symmetrical components of the source signal. By using an amplitude reference circuit that tracks the amplitude of the fundamental or other desired frequency of the source signal, the synthesized output is representative of the positive sequence components in phase and magnitude. This is helpful where the source signal is distorted and is useful in power-active filter applications. By providing a second synthesizer, both in-phase and quadrature components can be produced which are useful in phasor analysis. These components can be applied to any arbitrary set of multiphase signals to resolve them into their real and reactive portions. This would for useful for measuring real power and reactive power. However when used in a phasor analysis application, a precise amplitude reference should be employed. In addition the circuits with proper modification can be used in multiphase applications where the number of phases is other than 3.

The phase locked loop synthesizer circuits described have numerous applications in many control and measurement problems encountered in power electronic and electrical systems. The circuits described will produce a stable, phase locked digital timing signal which is insensitive to source signal distortion and disturbances and which can maintain phase lock even when only one phase of the source signal is present and will maintain outputs even if all phases of the source input signals are lost. Because the signals are generated through the use of memory devices, generation of precise symmetrically displaced, fixed amplitude sine and cosine sequence component outputs is possible. These synthesized sequence components can be multiplied by voltage or current signals to measure the magnitude of their real and imagninary (phase and quadrature) components at the fundamental or other selected frequency. A precise set of cosine timing waves for use in a cosine crossing control for a thyristor converter or cycloconverter can be generated. With these synthesizers, a very precise cosine crossing control employing binary coded reference and cosine timing waves and employing digital comparators to determine thyristor firing and end stop angles can be realized. These circuits also provide for the precise, positive sequence set of symmetrical components for use as reference waveforms for an active power filter or conditioner. Lastly, the circuits may be used to obtain a set of symmetrical components representative of and phase locked to any positive, negative or zero sequence set of fundamental or harmonic frequency which is present in the multiphase source signal.

Other embodiments of the invention will be apparent to those skilled in the art from a consideration of the specification or from practice of the invention disclosed herein. It is intended that the specification be considered as exemplary only, with the scope and spirit of the present invention being indicated by the following claims.

I claim:
1. A circuit, comprising:
   phase comparator means having as inputs thereto first a multiphase digitally synthesized sinusoidal output signal representative of a predetermined symmetrical component sequence set of a multiphase source signal and second said multiphase source signal, said multiphase source signal having a predetermined phase relationship with said multiphase digitally synthesized sinusoidal output signal, said phase comparator means producing a phase error output signal representative of the phase error in the predetermined phase relationship between the phase of the source signal and the phase of the synthesized output signal when one of the phases of the source signal is present at the input thereof;
   phase shifting means having a variable frequency output for shifting the phase of the synthesized output signal in response to the phase error output signal for reducing the phase error in the predetermined phase relationship between the source signal and the synthsized output signal; and
   synthesizer means for digitally synthesizing at a predetermined amplitude said multiphase synthesized output signal having the predetermined phase relationship with the source signal, the synthesizer means responsive to the phase shifting output for varying the phase of the synthesized output signal to decrease the phase error in the predetermined phase relationship between the source signal and the synthesized output signal thereby locking in the synthesized output signal in the predetermined phase relationship to the predetermined symmetrical component sequence set of the source signal when the phase error output signal is substantially zero.

2. The circuit of claim 1 wherein the the multiphase source signal and multiphase synthesized output/signal have three phases.

3. The circuit of claim 2 wherein the predetermined symmetrical component sequence set is the positive sequence set of the source signal.

4. The circuit of claim 3 wherein the synthesized output signal and the source signal have a predetermined phase relationship in which they are in phase.

5. The circuit of claim 3 wherein the synthesized output signal and the source signal have a predetermined phase relationship in which they are in quadrature.

6. The circuit of claim 2 wherein the predetermined symmetrical component sequence set is the negative sequence set of the source signal.

7. The circuit of claim 6 wherein the synthesized output signal and the source signal have a predetermined phase relationship in which they are in phase.

8. The circuit of claim 6 wherein the synthesized output signal and the source signal have a predetermined phase relationship in which they are in quadrature.

9. A circuit comprising:
   phase comparator means having as inputs thereto a multiphase digitally synthesized sinusoidal output signal representative of a predetermined symmetrical component sequence set of a multiphase source signal and said multiphase source signal, said multiphase source signal having a predetermined phase relationship with said multiphase digitally synthesized sinusoidal output signal, the phase comparator means producing a phase error output signal representative of the phase error in the predetermined phase relationship between the phase of the source signal and the phase of the synthesized output signal when one of the phases of the source signal is present at the input thereof; wherein said phase comparator means comprises:

a multiplier for each phase, each multiplier having a first input and second input connected to corresponding phases of the souce signal and synthesized output signal, respectively, and an output:

means for summing the outputs of the multipliers for the phases and producing the phase error output signal;

phase shifting means having a variable frequency output for shifting the phase of the synthesized output signal in response to the phase error output signal for reducing the phase error in the predetermined phase relationship between the source signal and the synthesized output signal; and synthesizer means for digitally synthesizing at a predetermined amplitude said multiphase synthesized output signal having the predetermined phase relationship with the source signal, the synthesizer means responsive to the phase shifting output for varying the phase of the synthesized output signal to decrease the phase error in the predetermined phase relationship between the source signal and the synthesized output signal thereby locking in the synthesized output signal in the predetermined phase relationship to the predetermined symmetrical component sequence set of the source signal when the phase error output signal is substantially zero.

10. A circuit, comprising:

phase comparator means having as inputs thereto first a multiphase digitally synthesized sinusoidal output signal representative of a predetermined symmetrical component sequence set of a multiphase source signal and second said multiphase source signal, said multiphase source signal having a predetermined phase relationship with said multiphase digitally synthesized sinusoidal output signal, the phase comparator means producing a phase error output signal representative of the phase error in the predetermined phase relationship between the phase of the source signal and the phase of the synthesized output signal when one of the phases of the source signal is present at the input thereof;

phase shifting means responsive to the phase error output signal for producing a phase shifting output signal having a frequency transiently changeable in response to the phase error out signal, the phase shifting output locking in phase with the source signal when the phase error output signal is substantially zero with the frequency of phase shifting output being substantially constant; and synthesizer means for digitally synthesizing at a predetermined amplitude the multiphase synthesized output signal having the predetermined phase relationship with the source signal, the synthesizer means responsive to the phase shifting output for varying the phase of the synthesized output signal to decrease the phase error in the predetermined phase relationship between the source signal and the synthesized output signal thereby locking in the synthesized output signal in the predetermined phase relationship to the predetermined symmetrical component sequence set of the source signal when the phase error output signal is substantially zero.

11. The circuit of claim 10 wherein the multiphase source signal and multiphase synthesized output signal have three phases.

12. The circuit of claim 11 wherein the predetermined symmetrical component sequence set is the positive sequence set of the source signal.

13. The circuit of claim 12 wherein the synthesized output signal and the source signal have a predetermined phase relationship in which they are in phase.

14. The circuit of claim 12 wherein the synthesized output signal and the source signal have a predetermined phase relationship in which they are in quadrature.

15. The circuit of claim 11 wherein the predetermined symmetrical component sequence set is the negative sequence set of the source signal.

16. The circuit of claim 15 wherein the synthesized output signal and the source signal have a predetermined phase relationship in which they are in phase.

17. The circuit of claim 15 wherein the synthesized output signal and the source signal have a predetermined phase relationship in which they are in quadrature.

18. A circuit comprising:

phase comparator means having as inputs thereto a multiphase digitally synthesized sinusoidal output signal representative of a predetermined symmetrical component sequence set of a multiphase source signal and said multiphase source signal, said multiphase source signal having a predetermined phase relationship with said multiphase digitally synthesized sinusoidal output signal, the phase comparator means producing a phase error output signal representative of the phase error in the predetermined phase relationship between the phase of the source signal and the phase of the synthesized output signal when one of the phases of the source signal is present at the input thereof, said phase comparator means comprises:

an analog multiplier for each phase, each multiplier having a first input and second input connected to corresponding phases of the source signal and synthesized output signal, respectively, and an output;

means for summing the outputs of the multipliers for the phases and producing the phase error output signal;

phase shifting means responsive to the phase error output signal for producing a phase shiftting output signal having a frequency transiently changeable in response to the phase error out signal, the phase shifting output locking in phase with the source signal when the phase error output signal is substantially zero with the frequency of phase shifting output being substantially constant; and synthesizer means for digitally synthesizing at a predetermined amplitude the multiphase synthesized output signal having the predetermined phase relationship with the source signal, the synthesizer means responsive to the phase shifting output for varying the phase of the synthesized output signal to decrease the phase error in the predetermined phase relationship between the source signal and the synthesized output signal thereby locking in the synthesized output signal in the predetermined phase relationship to the predetermined symmetrical component sequence set of the source signal when the phase error output signal is substantially zero.

19. The circuit of claim 18 wherein the phase shifting means comprises:
an integrator having an input and an output, the input receiving the phase error output signal of the phase comparator means with the output of the integrator being a dc signal substantially proportional to the integrated value of the phase error output signal; and
a voltage controlled oscillator having an input and an output, the input receiving the dc signal output of the integrator with the output signal of the oscillator having a frequency dependent on the magnitude of the dc signal at the input thereof.

20. The circuit of claim 19 wherein the synthesizer comprises:
a digital counter having a clock input clocked by the output of the voltage controlled oscillator and having a reset input and a digital address count output variable from a starting address count value s to an final address count value f where (f−s)+1 represents the number of steps into which the period of the synthesized output signal is divided with the address count corresponding on a one-for-one basis to the number of step within the period of the synthesized output signal;
memory storage means responsive to the address count output of the counter for providing digital data representative of the amplitude for each of the phases of the synthesized output signal from a preprogrammed look-up table having a plurality of individually accessible addresses corresponding to the address count output value of the counter and having stored thereat the digital values representative of the amplitude for each of the phases at that step within the period of the synthesized output signal corresponding to the address count output, the memory storage means having an output data bus on which is presented the digital values for each phase of the synthesized output signal;
digital-to-analog (D/A) converter means connected to the output data bus of the memory storage means of each phase for converting the digital values representative of the output amplitude for each phase at each step in the period of the synthesized output signal into a substantially continuous sinusoidal waveform for each phase thereby forming the multiphase synthesized output signal;
amplitude reference means connected to the D/A converter for setting the amplitude of the synthesized output signal produced by the D/A converter; and
reset means for resetting the counter to the start address count value s when the counter address output value reaches the final address count value f.

21. A circuit, comprising:
phase comparator means having as inputs thereto a multiphase digitally synthesized sinusoidal signal representative of a predetermined symmetrical component sequence set of a multiphase source signal and said multiphase source signal, said multiphase source ssignal having a predetermined phase relationship with said multiphase digitally synthesized sinusoidal output signal, the phase comparator means producing a phase error output signal representative of the phase error in the predetermined phase relationship between the phase of the source signal and the phase of the synthesized output signal when one of the phases of the source signal is present at the input thereof; the phase comparator means comprising:
an analog/digital multiplier for each phase, each multiplier having a first input connected to a phase of the source signal, a second input for receiving digital values representative of the phase relationship of the synthesized output signal corresponding to that connected to the first input, and an output;
means for summing the outputs of the multipliers for the phases and producing the phase error output signal;
phase shifting means responsive to the phase error output signal for producing a phase shifting output signal having a frequency transiently changeable in response t the phase error output signal, the phase shifting output locking in phase with the source signal when the phase error output signal is substantially zero with the frequency of phase shifting output being substantially constant, the phase shifting means comprising:
an integrator having an input and an output, the input receiving the phase error output signal of the phase comparator means with the output of the integrator being a dc signal substantially proportionaal to the integrated value of the phase error output signal;
a voltage controlled oscillator having an input and an output, the input receiving the dc signal output of the integrator with the output signal of the oscillator having a frequency dependent on the magnitude of the dc signal at the input thereof; and
synthesizer means for digitally synthesizing at a predetermined amplitude said multiphase synthesized output signal having the predetermined phase relationship with the source signal, the synthesizer means responsive to the phase shifting output for varying the phase of the synthesized output signal to decrease the phase error in the predetermined phase relationship between the souce signal and the synthesized output signal thereby locking in the synthesized output signal in the predetermined phase relationship to the predetermined symmetrical component sequence set of the source signal when the phase error output signal is substantially zero; the synthesizer means comprising:
a digital counter having a clock input clocked by the output of the voltage controlled oscillator and having a reset input and a digital address count output variable from a starting address count value s to a final address count f where (f−s)+1 represents the number of steps into which the period of the synthesized output signal is divided with the address count corresponding on a one-for-one basis to the number of steps within the period of the synthesized output signal;
non-volatile memory means responsive to the address count output of the counter for providing digital values representative of the phase relationship for each of the phases of the synthesized output signal and the corresponding phase of the source signal from a preprogrammed look-up table having a plurality of individually accessible addresses corresponding to the address count output of the counter and having stored thereat the digital values representative of the phase relationship for each of the phases at that step within the period of the synthesized output signal corresponding to the address count output, the memory means having an output data bus on which is presented the digital values for each phase of the synthesized output signal and which is connected to the second input of the digital/analog multipliers so as to provide the digital data representative of the phase relationship of the phase of the synthesized output signal corresponding to the phase of the source signal at the first input thereof; and reset means for resetting the counter to the start address count value s when the counter address output value reaches the final address count value f.

22. The circuit of claim 21 wherein the multiphase source signal and multiphase synthesized output signal have three phases.

23. The circuit of claim 22 wherein the predetermined symmetrical component sequence set is the positive sequence set of the source signal.

24. The circuit of claim 23 wherein the synthesized output signal and the source signal have a predetermined phase relationship in which they are in phase.

25. The circuit of claim 23 wherein the synthesized output signal and the source signal have a predetermined phase relationship in which they are in quadrature.

26. The circuit of claim 22 wherein the predetermined symmetrical component sequence set is the negative sequence set of the source signal.

27. The circuit of claim 26 wherein the synthesized output signal and the souce signal have a predetermined phase relationship in which they are in phase.

28. The circuit of claim 27 wherein the synthesized output signal and the source signal have a predetermined phase relationship in which they are in quadrature.

29. The circuit of claim 22 wherein the digital address count output of the counter is an 8 bit binary value and the quantity $((f-s)+1)$ equals 252.

30. The circuit of claim 22 wherein the digital address count output of the counter is a 12 bit binary value and the quantity $((f-s)+1)$ equals 4096.

31. The circuit of claim 22 wherein the digital address count output of the counter is a 16 bit binary value and the quantity $((f-s)+1)$ equals 65,532.

* * * * *